US011676000B2

(12) United States Patent
Singh et al.

(10) Patent No.: US 11,676,000 B2
(45) Date of Patent: Jun. 13, 2023

(54) DRILL BIT REPAIR TYPE PREDICTION USING MACHINE LEARNING

(71) Applicant: HALLIBURTON ENERGY SERVICES, INC., Houston, TX (US)

(72) Inventors: Ajay Pratap Singh, Houston, TX (US); Roxana Nielsen, Conroe, TX (US); Satyam Priyadarshy, Herdon, VA (US); Ashwani Dev, Katy, TX (US); Geetha Gopakumar Nair, Katy, TX (US); Suresh Venugopal, Spring, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 567 days.

(21) Appl. No.: 16/611,817

(22) PCT Filed: Aug. 31, 2018

(86) PCT No.: PCT/US2018/049065
§ 371 (c)(1),
(2) Date: Nov. 7, 2019

(87) PCT Pub. No.: WO2020/046366
PCT Pub. Date: Mar. 5, 2020

(65) Prior Publication Data
US 2020/0149354 A1    May 14, 2020

(51) Int. Cl.
*G06N 3/042*        (2023.01)
*E21B 10/62*        (2006.01)
(Continued)

(52) U.S. Cl.
CPC ............. *G06N 3/042* (2023.01); *E21B 10/46* (2013.01); *E21B 10/62* (2013.01); *E21B 12/02* (2013.01);
(Continued)

(58) Field of Classification Search
CPC ........ E21B 10/633; E21B 10/43; E21B 10/42; E21B 33/00; E21B 12/02; E21B 10/46;
(Continued)

(56) References Cited

U.S. PATENT DOCUMENTS 7,142,986 B2    11/2006 Moran
9,022,140 B2    5/2015 Marx et al.
(Continued)

FOREIGN PATENT DOCUMENTS

EP        1193366 A2    4/2002

OTHER PUBLICATIONS

Nazri Mohd Nawi, et al., "The Effect of Data Pre-Processing on Optimized Training of Artificial Neural Networks," Procedia Technology 11, pp. 32-39 (Year: 2013).*
(Continued)

*Primary Examiner* — Steven W Crabb
(74) *Attorney, Agent, or Firm* — Delizio, Peacock, Lewin & Guerra (57) ABSTRACT

The subject disclosure provides for a mechanism implemented with neural networks through machine learning to predict wear and relative performance metrics for performing repairs on drill bits in a next repair cycle, which can improve decision making by drill bit repair model engines, drill bit design, and help reduce the cost of drill bit repairs. The machine learning mechanism includes obtaining drill bit data from different data sources and integrating the drill bit data from each of the data sources into an integrated dataset. The integrated dataset is pre-processed to filter out outliers. The filtered dataset is applied to a neural network to build a machine learning based model and extract features that indicate significant parameters affecting wear. A repair type prediction is determined with the applied machine learning
(Continued)

based model and is provided as a signal for facilitating a drill bit operation on a cutter of the drill bit.

20 Claims, 5 Drawing Sheets

(51) Int. Cl.

| | |
|---|---|
| *E21B 12/02* | (2006.01) |
| *G06N 3/08* | (2023.01) |
| *E21B 10/46* | (2006.01) |
| *G06N 3/02* | (2006.01) |
| *G06N 20/00* | (2019.01) |
| *G06F 30/27* | (2020.01) |
| *E21B 4/06* | (2006.01) |

(52) U.S. Cl.
CPC ............... *G06F 30/27* (2020.01); *G06N 3/02* (2013.01); *G06N 3/08* (2013.01); *G06N 20/00* (2019.01); *E21B 4/06* (2013.01); *E21B 2200/20* (2020.05); *E21B 2200/22* (2020.05)

(58) Field of Classification Search
CPC ........ E21B 10/62; E21B 4/06; E21B 2200/20; E21B 2200/22; E21B 10/00; G06F 30/20; G06F 30/27; G06N 3/02; G06N 3/08; G06N 20/00; G06N 5/003; G06N 3/0454
See application file for complete search history.

(56) References Cited

U.S. PATENT DOCUMENTS

| | | | | |
|---|---|---|---|---|
| 2015/0106015 | A1 | 4/2015 | Dashevskiy et al. | |
| 2015/0107901 | A1 | 4/2015 | Eriksson et al. | |
| 2015/0167454 | A1 | 6/2015 | Kale et al. | |
| 2016/0076357 | A1* | 3/2016 | Hbaieb | E21B 44/00 702/9 |
| 2019/0187685 | A1* | 6/2019 | Cella | H04L 1/18 |
| 2019/0345809 | A1* | 11/2019 | Jain | E21B 49/003 |

OTHER PUBLICATIONS

Akhtar Khan, et al. "A Comprehensive GRNN Model for the Prediction of Cutting Force, Surface Roughness and Tool Wear During Turning of CP-Ti Grade 2," Silicon 10:2181-2191 (Year: 2018).*
Korean Intellectual Property Office, International Search Report and Written Opinion, dated May 27, 2019, 9 pages, Korea.
Shilin Chen, Greg Grosz, Seth Anderle, Rob Arfele and Keshan Xun, The Role of Rock-Chip Removals and Cutting-Area Shapes in Polycrystalline-Diamond-Compact-Bit Design Optimization, Nov. 10-13, 2014, 14 pages, Abu Dhabi International Petroleum Exhibition and Conference, SPE 171833, Society of Petroleum Engineers, Abu Dhabi.
S.Chen, R.Arfele, S.Anderle and J.Romero, A New Theory on Cutter Layout for Improving PDC-Bit Performance in Hard-and Transit-Formation Drilling, Mar. 26-28, 2013, 12 pages, International Petroleum Technology Conference, SPE 168224, Society of Petroleum Engineers, Beijing, China.
Yaneng Zhou, Numerical Modeling of Rock Drilling with Finite Elements, 2003, 171 pages, PhD dissertation, University of Pittsburgh.
Ali A. Moslemi, Reza Rahmani, Ryan Graham and Brad Ivie, Hydraulic Design of Shale Drill Bit Using an Integrated Numerical and Experimental Approach, Mar. 17-19, 2015, 18 pages, SPE/IADC Drilling Conference and Exhibition, SPE/IADC-173038-MS, SPE/IADC Drilling Conference and Exhibition, London, United Kingdom.
Ali Moslemi, Jason Cunningham, Alan Wang and Alexis Garcia, Field Tests of Drill Bits With Enhanced Hydraulic Design, Aug. 22-24, 2016, IADC/SPE Asia Pacific Drilling Technology Conference, IADC/SPE-180643-MS, IADC/SPE Asia Pacific Drilling Technology Conference, Singapore.
R.A. Arehart, Drill-Bit Diagnosis With Neural Networks, Oct. 8-11, 1990, 5 pages, 1989 SPE Annual Technical Conference and Exhibition, Society of Petroleum Engineers, Inc., San Antonio, Texas.
H.I. Bilgesu, A.F. Al-Rashidi, K.Aminian, S.Ameri, An Unconventional Approach for Drill-Bit Selection, Mar. 17-20, 2001, 6 pages, 2001 SPE Middle East Oil Show, SPE 68089, Society of Petroleum Engineers Inc., Bharain.

* cited by examiner

DRILL BIT REPAIR TYPE PREDICTION USING MACHINE LEARNING

TECHNICAL FIELD

The present description relates in general to downhole measurement systems, and more particularly to, for example, without limitation, drill bit repair type prediction using machine learning.

BACKGROUND

In the oil and gas exploration and production industry, a wellbore is drilled from surface utilizing a string of tubing carrying a drill bit. Drilling fluid known as drilling 'mud' is circulated down through the drill string to the bit, and serves various functions. These include cooling the drill bit and returning drill cuttings to surface along an annulus formed between the drill string and the drilled rock formations. The drill string is typically rotated from surface using a rotary table or top drive on a rig. However, in the case of a deviated well, a downhole motor may be provided in the string of tubing, located above the bit. The motor is driven by the drilling mud circulating through the drill string, to rotate the drill bit.

The drill bit life can vary depending on the wear condition of the drill bit over a duration of time in certain drilling conditions. Repairs can be performed on the drill bit as a means to extend the drill bit life. However, performance and profitability of drill bits can be adversely impacted by repair costs.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, without departing from the scope of this disclosure.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations. In one or more instances, well-known structures and components are shown in block diagram form in order to avoid obscuring the concepts of the subject technology.

Fixed cutter drill bit profitability in a drill bit marketplace is directly impacted by repair costs. To improve drill bit life, performance, and profitability requires an understanding of how various parameters impact the wear of drill bits. Some traditional drill bit repair models are based on physics including parameters affecting wear. However, the subject disclosure provides for a machine learning mechanism to predict required repairs on drill bits, as the subject technology is faster to build and test compared to the traditional models, and there is no limitation to the size or type of data to be used given a wealth of historical data describing drill bit performance, characteristics, and wear condition. Having a reliable model that can predict wear and relative performance metrics can improve decision making by drill bit repair model engines, drill bit design, and help reduce the cost of drill bit repairs.

The disclosed system addresses a problem in traditional drill bit modeling systems tied to computer technology, namely the technical problem of integrating parameters from different data sources for the generalization of various drill bit designs. To build engineering models for each type of drill bit and drilling condition is costly and time consuming. In addition, the engineering models do not include categorical variables, whereas the machine learning based models can leverage categorical data, and through historical data can build predictive models. The subject technology provides several advantages over traditional drill bit models. For example, engineering models exist, but they are complex. The traditional engineering models are not built upon on machine learning to predict drill bit repairs required in a next repair cycle. The traditional engineering models also do not include a machine learning based workflow to assist in drill bit selection or design using historical drilling and repair data.

The disclosed system further provides improvements to the functioning of the computer itself because it saves data storage space and reduces the cost of system resources. Specifically, the subject technology helps to reduce data storage space by means of efficiencies in the maintenance process through improved accuracy in forecasting repair costs and required inventory. The subject technology also helps to reduce the cost of system resources by means of efficiencies gained through proactive, faster, and better decision making using the machine learning model.

The subject technology leverages a drill bit dataset that includes design, diamond distribution, repair, and drilling condition information to build a data driven model which can predict, prior to a drilling job, what kind of repair would be needed for a drill bit. The subject technology can integrate various data sources and filters outliers. After the cleaned dataset is built, a machine learning model is built. In some aspects, the machine learning model is a neural network based model. The objective of the model is to predict the required repair for each cutter in a drill bit based on drilling parameters, cutter properties, cutter design and position, and formation lithology. Two types of models can be built. In some implementations, the first model is a decision tree based model. In other implementations, the second model is a neural network based model using deep learning. The decision tree based model can be used for a visual analysis of results and to gain high level insight of the drill bit repair type. The neural network based model can be used to improve accuracy of the repair type prediction. For both models, n-fold cross-validation can be performed to test for accuracy and robustness. After the models are built, important variables can be identified and defined. These different types of models can be used for drill bit selection, drill bit design improvement, and increased efficiency in the repair process.

Other advantages of the subject technology include 1) minimizing cutter replacement thereby resulting in lower repair costs, 2) Achieving faster decision making using machine learning models, 3) using historical data that is readily available and growing, and can be continuously used to extract useful information and improve the model, 4) achieving improvements in drill bit and cutter designs, as well as achieving improvements in the selection of bits for a given application based on results from the machine learning model, and 5) gaining increased profitability through optimized selection of drill bits for a given application and minimized repair costs.

Figure 1:
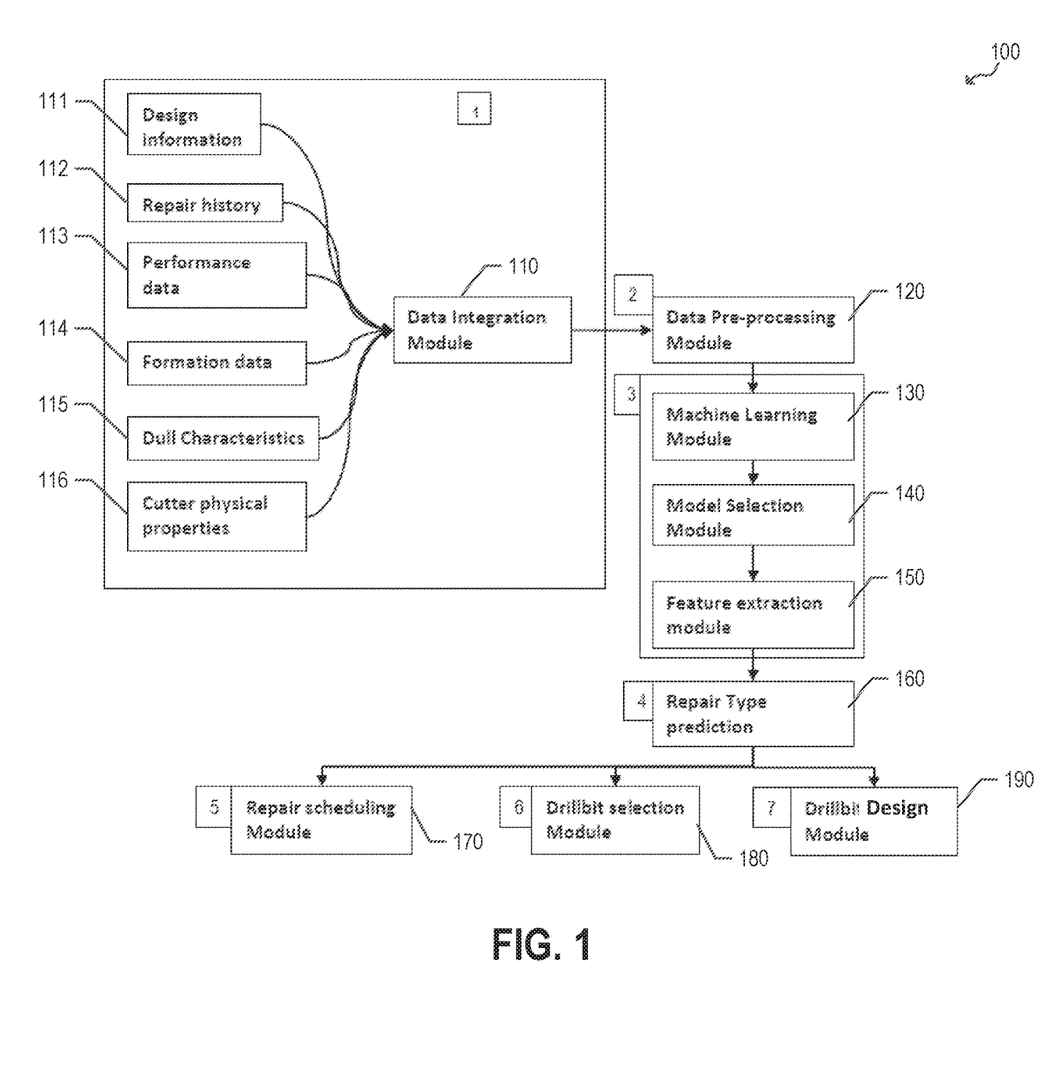
FIG. 1 illustrates a block diagram of an example process of creating a drill bit type repair prediction using machine learning according to certain aspects of the disclosure.

FIG. 1 illustrates a block diagram of an example process of creating a drill bit type repair prediction with a machine learning data system 100 according to certain aspects of the disclosure. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The machine learning data system 100 includes a data integration module 110, a data pre-processing module 120, a machine learning module 130, a model selection module 140, a feature extraction module 150, and a repair type prediction module 160. At the output of the machine learning data system 100, the repair type prediction module 160 can provide signaling to a repair scheduling module 170, a drill bit selection module 180, and/or a drill bit design module 190.

The subject technology provides for building a machine learning model that utilizes all available historical data, such as drilling conditions, drill bit design, geology of the field where the drill bit was used, etc., and predicts the required repair before the drill bit is run in a future site job. The machine learning model can be used for predicting needed drill bit repairs, drill bit selection, drill bit design and reliability improvement, and for improving the efficiency of the repair process, through optimization for both drill bit wear and performance. Typically, traditional models are based only on engineering fundamentals or finite element analysis that are used for predicting wear; however, these traditional models require design of experiments, which only work with continuous data, and potentially require different models to be created for each drill bit design, resulting in a very time intensive and complex process.

The data integration module 110 is configured to integrate different sources of information that is used to build a machine learning model and is merged into a large dataset that can serve as input variables to the machine learning model. In some implementations, the data integration module 110 is communicatively coupled to the different sources through individual application programming interfaces (APIs). The different sources of information include, but are not limited to, drill bit design information 111, repair history 112, performance data 113, formation data 114, dull characteristics 115, and cutter physical properties 116. The drill bit design information 111 is a dataset that includes cutter location and orientation on a drill bit. For example, the cutter location may indicate an identifier relative to neighboring cutters or may indicate a coordinate on the drill bit. The orientation information may include phase information relative to an axis of the drill bit or relative to other neighboring cutters. The repair history 112 is a dataset that includes the sequence of repairs required for individual cutters in a drill bit design. The repair history 112 may include a historical distribution of repairs made to the individual cutters including the frequency of certain types of repairs made to the individual cutters. The dull characteristics 115 is a dataset that classifies wear into recognized wear patterns. The formation data 114 is a dataset that includes the lithology of one or more subterranean formations penetrated (or drilled) by each drill bit. The performance data 113 is a dataset that includes the operating conditions during drilling, the total length of the drilled wellbore, Weight-on-Bit (WOB) information, rotational information such as revolutions-per-minute (RPM), and Rate-of-Penetration (ROP) data. The cutter physical properties 116 is a dataset that includes parameters describing abrasion resistance, thermal and mechanical integrity, and impact resistance.

The data pre-processing module 120 is configured to remove outliers and data with missing values. In some aspects, the data pre-processing module 120 utilizes one or more filtering algorithms to remove one or more data points that exceed a predetermined threshold and/or reside outside a predetermined cluster of data points by a measured amount. The data pre-processing module 120 is also configured to calculate the following variables: 1) last repair type, 2) wellbore trajectory during a drill bit run, 3) diamond volume distribution, 4) total length traveled by a cutter during drilling operation, 5) total energy absorbed by each cutter during the drilling operation, 6) normalized distance of each cutter from the center of the drill bit. The data pre-processing module 120 is also configured to calculate dynamic information. For example, if real time drilling data is available for ROP and RPM, the data pre-processing module 120 calculates statistical properties (e.g., minimum, maximum and standard deviation) for each variable. The inclusion of such variables can account for dynamic information, for example how cutter wear is also related to a large variation in drilling variables.

The machine learning module 130 is configured to receive all input variables that can be used to build a data driven model. The objective of the machine learning based model is to predict a repair action for each cutter based on drilling parameters, cutter design and position, and formation lithology. The machine learning module 130 may utilize the, or at least a portion of, input variables to train the machine learning based model. The training may be performed with a feedforward network, where each of the input variables is assigned to a weighted classification. The machine learning based model may be a neural network such as a deep learning model. In some aspects, the neural network may be a convolutional neural network. The neural network may include multiple layers (e.g., input layer, hidden layers, output layer) including a back propagation layer. The machine learning module 130 is configured to generate the machine learning based model for classification, clustering, and/or predictive analytics by regression.

The model selection module 140 is configured to select among several classes of machine learning models. If the user objective is to gain visual insight about decision making, the model selection module 140 selects a decision tree model. If the user objective is to use results for optimization, the model selection module 140 selects a deep learning based model. The model selection module 140 may receive user input indicating the user objective. The user input may be received concurrently with the integrated dataset from the data integration module 110 through the data pre-processing module 120 in some implementations, or the user input may be received independently via a user interface to the machine learning data system 100.

The feature extraction module 150 is configured to determine features of each cutter on a drill bit and identify significant parameters affecting wear on the cutter through the machine learning based models. The extracted features can provide insight into what drilling conditions and design specifications have the most impact on wear and how changes to those parameters can optimize repair costs.

The repair type prediction module 160 is configured to provide signaling indicating repair type prediction such that the machine learning based model with the highest accuracy is used to predict the next repair required for each cutter on a drill bit. In some implementations, the repair type prediction module 160 provides a vector indicating the type of repair for individual cutters on a drill bit. The vector may include values identifying a type of repair to reduce wear or a type of repair to increase drilling performance.

The repair scheduling module 170 is configured to generate a repair schedule for performing one or more repair actions in sequence or in parallel depending on implementation. The repair scheduling module 170 may be configured to receive user input indicating one or more calendar rules that are integrated with one or more repair type values from the repair type prediction to limit the repair schedule to a desired timeframe. Through prediction of repairs required for drill bits in inventory and in the field, repair work scheduling and inventory can be optimized for efficiency.

The drill bit selection module 180 may be a data driven model used in decision making to choose the best drill bit design for a given drilling application through a non-linear optimization algorithm for repair costs and performance. For example, the drill bit selection module 180 may compare the profitability metric of a first drill bit to the profitability metric of a second drill bit, and select (or indicate a preference for) the drill bit with the highest profitability metric. The drill bit selection module 180 may provide a representation of one or more drill bit designs as candidate selections for display. The drill bit selection module 180 may send signaling that prompts a user to select one of the candidate drill bit designs. The drill bit selection module 180 may be configured to receive user input indicating a user selection of a drill bit design in response to a display representation of the candidate drill bit designs.

The drill bit design module 190 may be a data driven model used to optimize a drill bit design for a given application during the design process. This will increase the profitability and performance of the resultant drill bit. The drill bit design module 190 may be configured to extract design rules from the repair type prediction and generate a drill bit design using the extracted design rules. The drill bit design module 190 may generate a drill bit design rendering that describes a drill bit designed to minimize wear during a given drilling operation application and/or increase the drilling performance of the cutters on the drill bit based on the repair type prediction.

Figure 2:
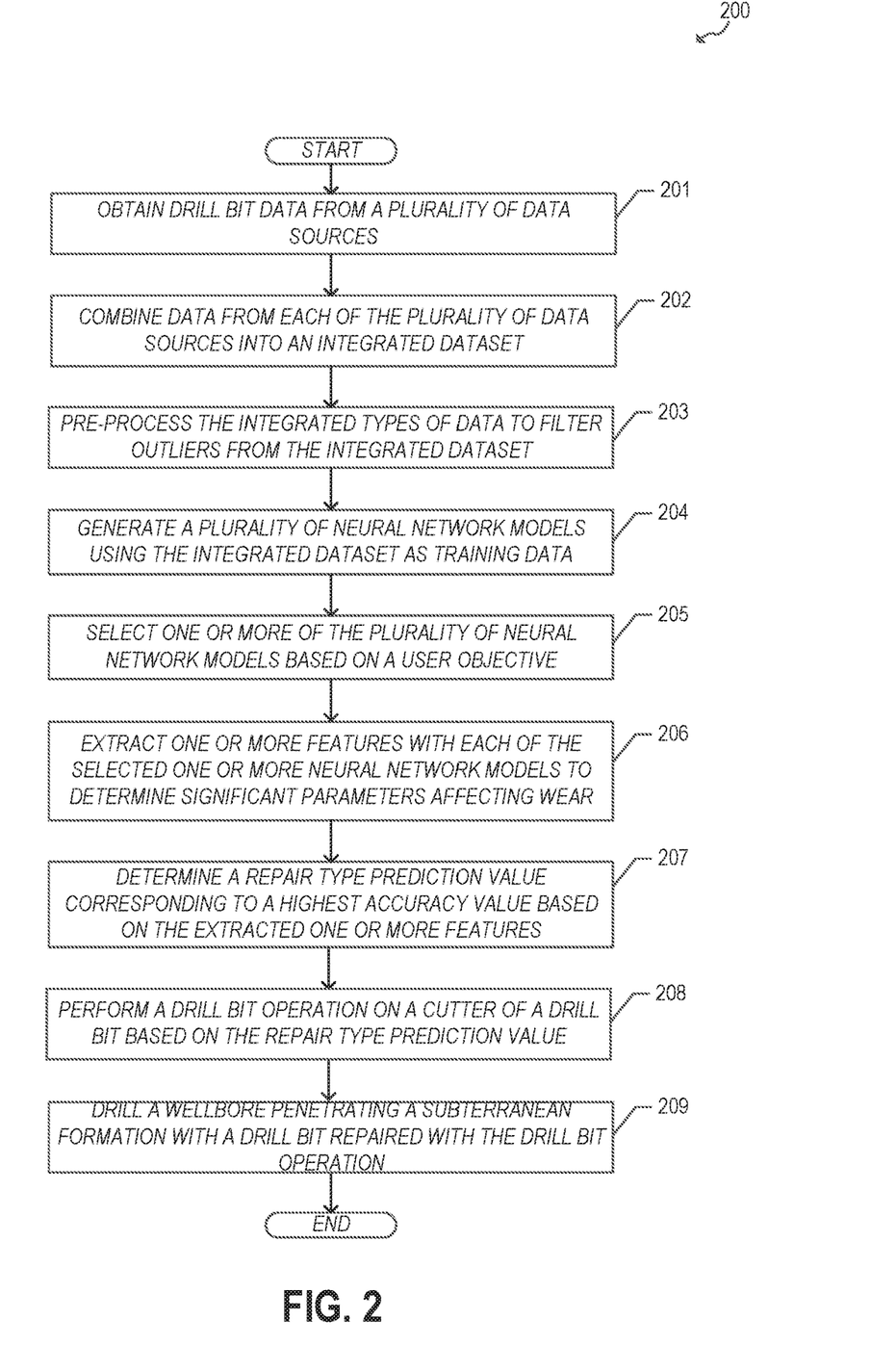
FIG. 2 illustrates an example process of creating a drill bit type repair prediction using a machine learning based model according to certain aspects of the disclosure.

FIG. 2 illustrates an example process 200 of creating a drill bit type repair prediction using a machine learning based model according to certain aspects of the disclosure. For explanatory purposes, the example process 200 is described herein with reference to the processor 338 of FIG. 3; however, the example process 200 is not limited to the processor 338 of FIG. 3, and one or more blocks of the example process 200 may be performed by one or more other components of the processor 338. Further for explanatory purposes, the blocks of the example process 200 are described herein as occurring in serial, or linearly. However, multiple blocks of the example process 200 may occur in parallel. In addition, the blocks of the example process 200 need not be performed in the order shown and/or one or more of the blocks of the example process 200 need not be performed.

Figure 3:
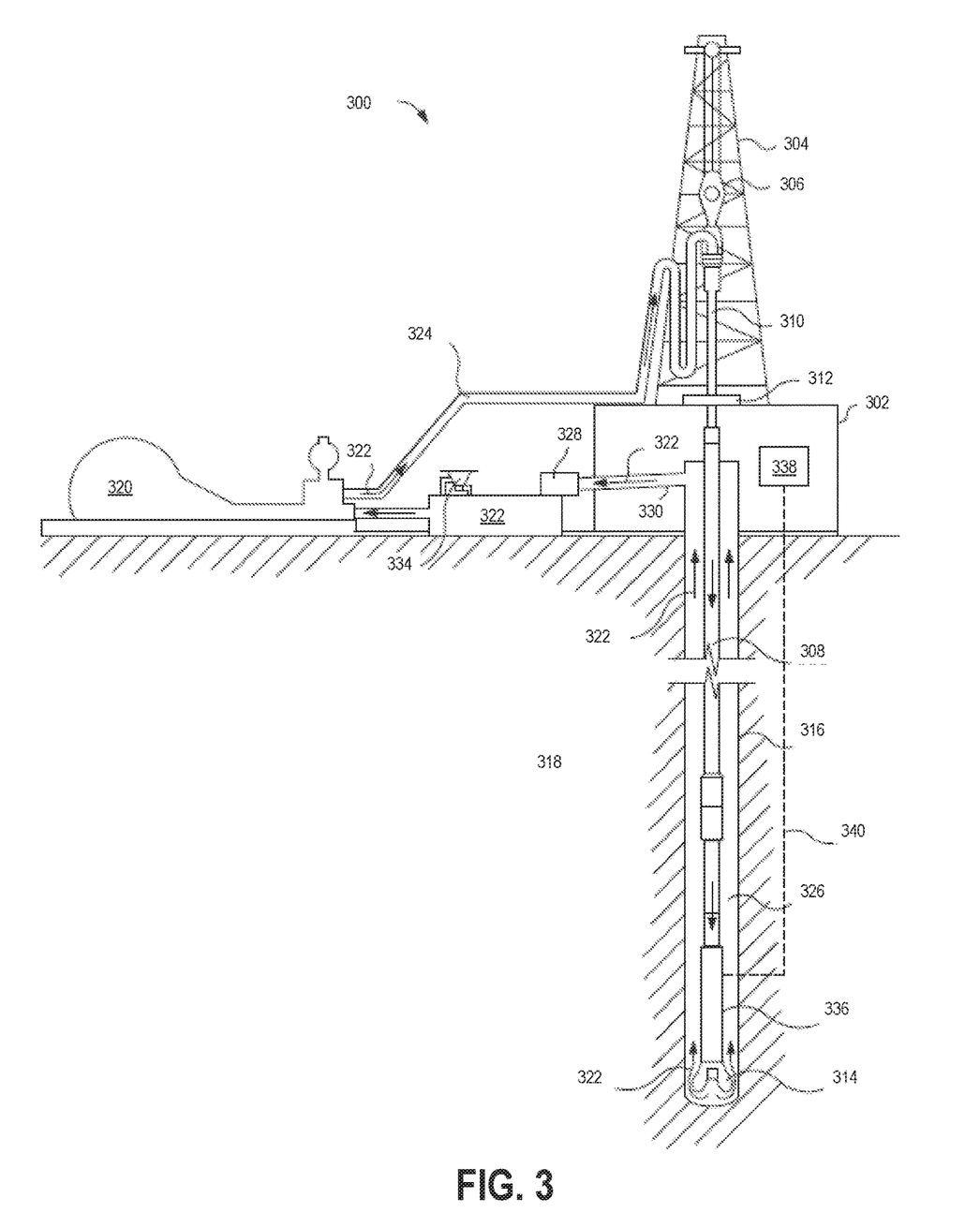
FIG. 3 illustrates an exemplary drilling assembly for implementing the processes described herein.

FIG. 3 illustrates an exemplary drilling assembly 300 for implementing the logging analysis methods described herein. It should be noted that while FIG. 3 generally depicts a land-based drilling assembly, those skilled in the art will readily recognize that the principles described herein are equally applicable to subsea drilling operations that employ floating or sea-based platforms and rigs, without departing from the scope of the disclosure.

As illustrated, the drilling assembly 300 may include a drilling platform 302 that supports a derrick 304 having a traveling block 306 for raising and lowering a drill string 308. The drill string 308 may include, but is not limited to, drill pipe and coiled tubing, as generally known to those skilled in the art. A kelly 310 supports the drill string 308 as it is lowered through a rotary table 312. A drill bit 314 is attached to the distal end of the drill string 308 and is driven either by a downhole motor and/or via rotation of the drill string 308 from the well surface. As the drill bit 314 rotates, it creates the wellbore 316 that penetrates various subterranean formations 318.

A pump 320 (e.g., a mud pump) circulates drilling mud 322 through a feed pipe 324 and to the kelly 310, which conveys the drilling mud 322 downhole through the interior of the drill string 308 and through one or more orifices in the drill bit 314. The drilling mud 322 is then circulated back to the surface via an annulus 326 defined between the drill string 308 and the walls of the wellbore 316. At the surface, the recirculated or spent drilling mud 322 exits the annulus 326 and may be conveyed to one or more fluid processing unit(s) 328 via an interconnecting flow line 330. After passing through the fluid processing unit(s) 328, a "cleaned" drilling mud 322 is deposited into a nearby retention pit 332 (i.e., a mud pit). While illustrated as being arranged at the outlet of the wellbore 316 via the annulus 326, those skilled in the art will readily appreciate that the fluid processing unit(s) 328 may be arranged at any other location in the drilling assembly 300 to facilitate its proper function, without departing from the scope of the scope of the disclosure.

Chemicals, fluids, additives, and the like may be added to the drilling mud 322 via a mixing hopper 334 communicably coupled to or otherwise in fluid communication with the retention pit 332. The mixing hopper 334 may include, but is not limited to, mixers and related mixing equipment known to those skilled in the art. In other implementations, however, the chemicals, fluids, additives, and the like may be added to the drilling mud 322 at any other location in the drilling assembly 300. In at least one implementation, for example, there may be more than one retention pit 332, such as multiple retention pits 332 in series. Moreover, the retention pit 332 may be representative of one or more fluid storage facilities and/or units where the chemicals, fluids, additives, and the like may be stored, reconditioned, and/or regulated until added to the drilling mud 322.

The processor 338 may be a portion of computer hardware used to implement the various illustrative blocks, modules, elements, components, methods, and algorithms described herein. The processor 338 may be configured to execute one or more sequences of instructions, programming stances, or code stored on a non-transitory, computer-readable medium. The processor 338 can be, for example, a general purpose microprocessor, a microcontroller, a digital signal processor, an application specific integrated circuit, a field programmable gate array, a programmable logic device, a controller, a state machine, a gated logic, discrete hardware components, an artificial neural network, or any like suitable entity that can perform calculations or other manipulations of data. In some implementations, computer hardware can further include elements such as, for example, a memory (e.g., random access memory (RAM), flash memory, read only memory (ROM), programmable read only memory (PROM), erasable programmable read only memory (EPROM)), registers, hard disks, removable disks, CD-ROMs, DVDs, or any other like suitable storage device or medium.

Executable sequences described herein can be implemented with one or more sequences of code contained in a memory. In some implementations, such code can be read into the memory from another machine-readable medium. Execution of the sequences of instructions contained in the memory can cause a processor 338 to perform the process steps described herein. One or more processors 338 in a multi-processing arrangement can also be employed to execute instruction sequences in the memory. In addition, hard-wired circuitry can be used in place of or in combination with software instructions to implement various implementations described herein. Thus, the present implementations are not limited to any specific combination of hardware and/or software.

As used herein, a machine-readable medium will refer to any medium that directly or indirectly provides instructions to the processor 338 for execution. A machine-readable medium can take on many forms including, for example, non-volatile media, volatile media, and transmission media. Non-volatile media can include, for example, optical and magnetic disks. Volatile media can include, for example, dynamic memory. Transmission media can include, for example, coaxial cables, wire, fiber optics, and wires that form a bus. Common forms of machine-readable media can include, for example, floppy disks, flexible disks, hard disks, magnetic tapes, other like magnetic media, CD-ROMs. DVDs, other like optical media, punch cards, paper tapes and like physical media with patterned holes, RAM, ROM, PROM, EPROM and flash EPROM.

The drilling assembly 300 may further include a bottom hole assembly (BHA) coupled to the drill string 308 near the drill bit 314. The BHA may comprise various downhole measurement tools such as, but not limited to, measurement-while-drilling (MWD) and logging-while-drilling (LWD) tools, which may be configured to take downhole measurements of the surrounding subterranean formations 318. Along the drill string 308, logging while drilling (LWD) or measurement while drilling (MWD) equipment 336 is included. In one or more implementations, the drilling assembly 300 involves drilling the wellbore 316 while the logging measurements are made with the LWD/MWD equipment 336. More generally, the methods described herein involve introducing a logging tool into the wellbore where the logging tool may be an LWD logging tool, a MWD logging tool, a wireline logging tool, slickline logging tool, and the like.

The LWD/MWD equipment 336 may transmit the measured data to a processor 338 at the surface wired or wirelessly. Transmission of the data is generally illustrated at line 340 to demonstrate communicable coupling between the processor 338 and the LWD/MWD equipment 336 and does not necessarily indicate the path to which communication is achieved. The LWD/MWD equipment 336 may include one or more sensors that may be communicably coupled to the line 340 used to transfer measurements and signals from the BHA to the processor 338 that processes the measurements and signals received by the LWD/MWD equipment 336 and/or controls the operation of the BHA.

In the subject technology, the LWD/MWD equipment 336 may be capable of logging analysis of the subterranean formation 318 proximal to the wellbore 316. In some aspects, the LWD/MWD equipment 336 obtains measurements relating to the operation of the drill bit 314. For example, the measurements may relate to the drill bit design information 111, the repair history 112, the performance data 113, the formation data 114, the dull characteristics 115, and the cutter physical properties 116. The steps of the process 200 are performed offline (i.e., not during a drilling operation), and may be performed on the surface by the processor 338 or at an offsite location, such as a datacenter (not shown). The process 200 starts at step 201 where drill bit data is obtained from a plurality of data sources by the processor 338 through respective APIs. This operation at step 201 may be performed offline (i.e., not during a drilling operation). Next, at step 202, data from each of the data sources is combined into an integrated data set by the processor 338 using the data integration module 110. Subsequently, at step 203, the integrated types of data are pre-processed by the processor 338 using the data pre-processing module 120 to filter outliers from the integrated data set. Next, at step 204, neural network based models are generated by the processor 338 using the machine learning module 130. The neural network based models are built using the integrated data set as training data. Subsequently, at step 205, one or more neural network based models are selected based on a user objective. In some aspects, the user objective indicates whether a more refined prediction with analytical insight into the drill bit repair actions is preferred. In some implementations, the user objective helps select between a decision tree for high level insight or the neural network based model. Next, at step 206, one or more features of a drill bit is extracted with each of the selected neural network based models to determine significant parameters of the drill bit affecting wear. Subsequently, at step 207, a repair type prediction value corresponding to a highest accuracy value based on the extracted one or more features is determined. Next, at step 208, a drill bit operation is performed on a cutter of the drill bit 314 based on the repair type prediction value. For example, the drill bit 314 may be repaired according to a repair schedule in a next repair cycle. Subsequently, at step 209, a wellbore penetrating a subterranean formation is drilled with the drill bit 314 repaired with the drill bit operation.

In some implementations, part of the processing may be performed by a telemetry module (not shown) in combination with the processor 338. In this respect, the telemetry module may be, or include a part of, the data pre-processing module 120. For example, the telemetry module may pre-process data signals from the data integration module 110 (e.g., through signal conditioning, filtering, and/or noise cancellation), either collectively or individually, and transmit them to a surface data processing system (e.g., the processor 338) for further processing offline, where the machine learning based model is computed and built, and any repair type predictions are determined therewith. In at least one implementation, the processor 338 may be configured to provide a representation of the repair type prediction for display to facilitate one or more use cases, such as repair scheduling, drill bit design selection, and/or drill bit design optimization. The telemetry module may encompass any known means of downhole communication including, but not limited to, a mud pulse telemetry system, an acoustic telemetry system, a wired communications system, a wireless communications system, or any combination thereof. In certain implementations, some or all of the measurements taken by the sensors coupled to the LWD/MWD equipment 336 may also be stored within a memory associated with the telemetry module for later retrieval at the surface upon retracting the drill string 308.

Figure 4:
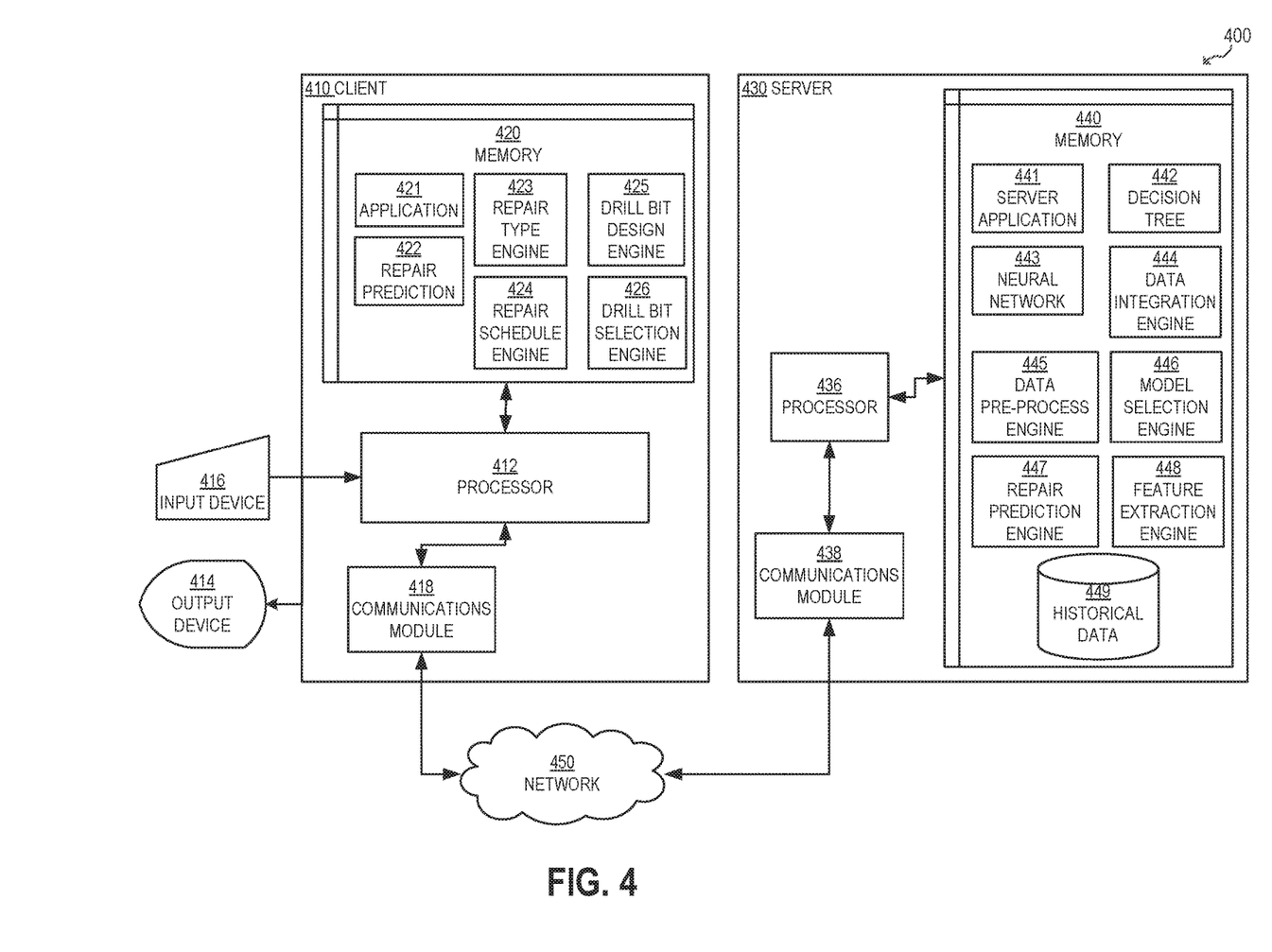
FIG. 4 is a block diagram illustrating an example client and server according to certain aspects of the disclosure.

FIG. 4 is a block diagram illustrating an example server 430 and client 410 in the architecture 400 of FIG. 4 according to certain aspects of the disclosure. The client 410 may represent a surface client computing device (not shown) and the server 430 may represent the processor 338 of FIG. 3 in some implementations, or the client 410 may represent the processor 338 and the server 430 may represent the off-site computing facilities in other implementations.

The client 410 and the server 430 are connected over the network 450 via respective communications modules 418 and 438. The communications modules 418 and 438 are configured to interface with the network 450 to send and receive information, such as data, requests, responses, and commands to other devices on the network. The communications modules 418 and 438 can be, for example, modems or Ethernet cards.

The server 430 includes a memory 432, a processor 436, and a communications module 438. The memory 432 of the server 430 includes a server application 441, a decision tree engine 442, a neural network 443, a data integration engine 444, a data pre-process engine 445, a model selection engine 446, a repair prediction engine 447, and a feature extraction engine 448. The processor 436 of the server 430 is configured to execute instructions, such as instructions physically coded into the processor 436, instructions received from software in the memory 432, or a combination of both. The processor 436 of the server 430 executes instructions from the server application 441 causing the processor 436 to process drill bit information received from the client 410 over the network 450 in order to determine a repair type prediction using the neural network 443, for example, of the server 430. The memory 432 also includes historical data 449. The historical data 449 may include the logging measurements received from the client 410 over the network 450. In some aspects, the server 430 may post-process drill bit datasets that may be stored in the historical data 449.

The client 410 includes a processor 412, the communications module 418, and the memory 420 that includes an application 421. The application 421 may be a drill bit repair application, or physically coded instructions that execute a real-time analysis of a drill bit to predict required repair actions on a drill bit for a next repair cycle. The client 410 also includes an input device 416, such as a keyboard, mouse, touchscreen and/or controller, and an output device 414, such as a display. The memory 420 also includes repair prediction data 422, a repair type engine 423, a repair schedule engine 424, a drill bit design engine 425, a drill bit selection engine 426. In some aspects, the processor 412 receives user input via the input device 416, where the user input indicates a user objective to help select between different machine learning based models and a binary decision tree model.

The processor 412 of the client 410 is configured to execute instructions, such as instructions physically coded into the processor 412, instructions received from software in the memory 420, or a combination of both. The processor 412 of the client 410 executes instructions from the application 422 causing the processor 412 to run a process that generates a repair type prediction indicating an optimal repair to be performed on a cutter of a drill bit in a next repair cycle.

The data integration engine 444 may be, or include at least a portion of, the data integration module 110, which is configured to integrate different sources of information that is used to build a machine learning model and is merged into a large dataset that can serve as input variables to the machine learning model. In some implementations, the data integration module 110 is communicatively coupled to the different data sources through individual application programming interfaces (APIs). The different sources of information include, but are not limited to, drill bit design information, repair history, performance data, formation data, dull characteristics, and cutter physical properties, which may be stored in the historical data repository 449, or in a repository external to and accessible to the server 430, via the network 450.

The data pre-process engine 445 may be, or include at least a portion of, the data pre-processing module 120, which is configured to remove outliers and data with missing values. In some aspects, the data pre-process engine 445 utilizes one or more filtering algorithms to remove one or more data points that exceed a predetermined threshold and/or reside outside a predetermined cluster of data points by a measured amount.

The server application 441, using the machine learning module 130, is configured to train the neural network 443 to produce a machine learning based model that predicts a repair action for each cutter based on drilling parameters, cutter design and position, and formation lithology. In some aspects, the neural network 443 may be a convolutional neural network. The neural network 443 may include multiple layers (e.g., input layer, hidden layers, output layer) including a back propagation layer. The neural network 443 may be used for classification, clustering, and/or predictive analytics by regression of the drill bit information.

The model selection engine 446 may be, or include at least a portion of, the model selection module 140, which is configured to select among several classes of machine learning models. If the user objective is to gain visual insight about decision making, the model selection module 140 selects a decision tree model. If the user objective is to use results for optimization, the model selection module 140 selects a deep learning based model generated with the neural network 443. The model selection module 140 may receive user input indicating the user objective. The user input may be received concurrently with the integrated dataset from the data integration engine 444 through the data pre-process engine 445 in some implementations, or the user input may be received independently via a user interface such as through the input device 416 of the client 410.

The feature extraction engine 448 may be, or include at least a portion of, the feature extraction module 150, which is configured to determine features of each cutter on a drill bit and identify significant parameters affecting wear on the cutter through the machine learning based models. The extracted features can provide insight into what drilling conditions and design specifications have the most impact on wear and how changes to those parameters can optimize repair costs.

The repair prediction engine 447 may be, or include at least a portion of, the repair type prediction module 160, which is configured to provide signaling indicating a repair type prediction such that the machine learning based model with the highest accuracy is used to predict the next repair required for each cutter on a drill bit. In some implementations, the repair prediction engine 447 provides a vector indicating the type of repair for individual cutters on a drill bit. The vector may include values identifying a type of repair to reduce wear or a type of repair to increase drilling performance.

At the client 410, the repair type engine 423 may receive a repair type prediction value from the server 430 and store the repair type prediction value as the repair prediction data 422. The repair schedule engine 424 may be, or includes at least a portion of, the repair scheduling module 170, which is configured to generate a repair schedule for performing one or more repair actions in sequence or in parallel depending on implementation. The repair schedule engine 424 may be configured to receive user input indicating one or more calendar rules, via the input device 416, which are integrated with one or more repair type values from the repair type prediction to limit the repair schedule to a desired timeframe.

The drill bit selection engine 426 may be, or includes at least a portion of, the drill bit selection module 180, which may be a data driven model used in decision making to choose the best drill bit design for a given drilling application through a non-linear optimization algorithm for repair costs and performance. The drill bit selection engine 426 may provide a representation of one or more drill bit designs as candidate selections for display. The drill bit selection engine 426 may send signaling to the output device 414 that prompts a user to select one of the candidate drill bit designs. The drill bit selection engine 426 may be configured to receive user input, either via the input device 416 or via the output device 414, indicating a user selection of a drill bit design in response to a display representation of the candidate drill bit designs.

The drill bit design engine 425 may be, or includes at least a portion of, the drill bit design module 190 may be a data driven model used to optimize a drill bit design for a given application during the design process. The drill bit design engine 425 may be configured to extract design rules from the repair type prediction and generate a drill bit design using the extracted design rules. The drill bit design engine 425 may generate a drill bit design rendering that describes a drill bit designed to minimize wear during a given drilling operation application and/or increase the drilling performance of the cutters on the drill bit based on the repair type prediction.

Figure 5:
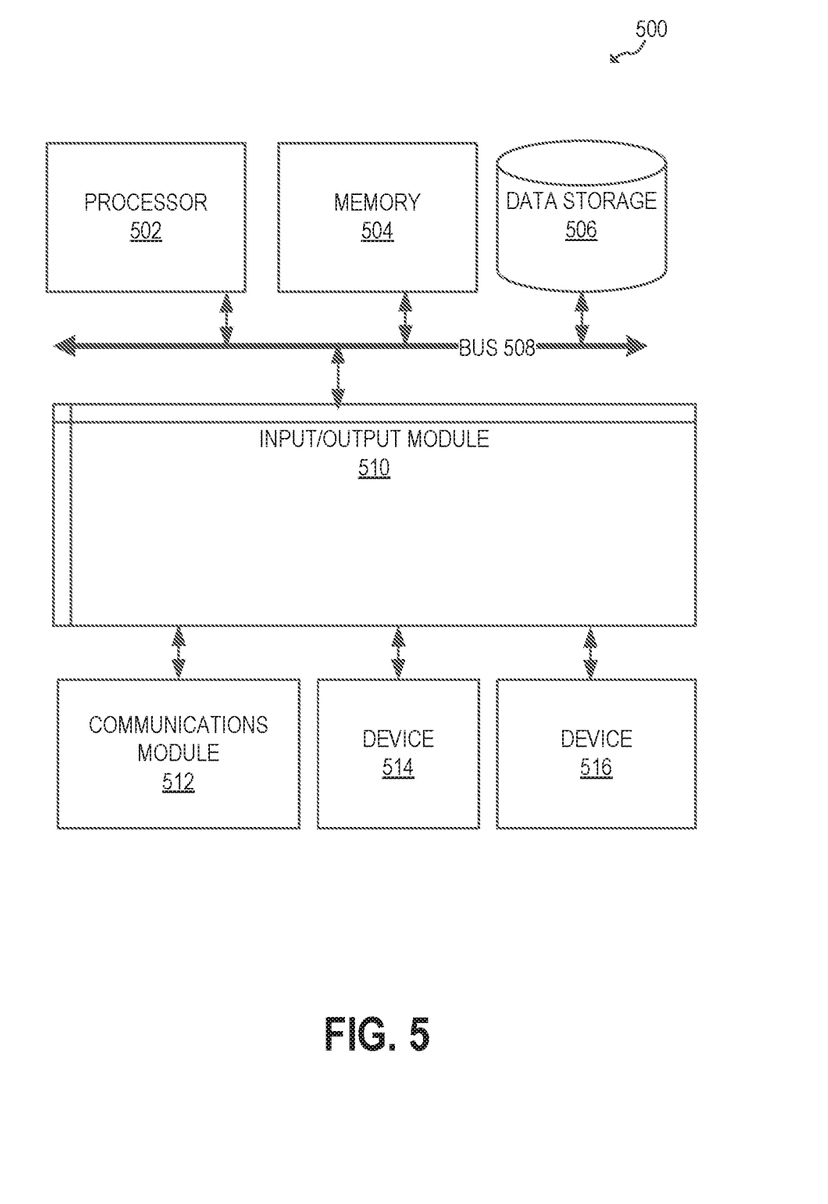
FIG. 5 is a block diagram illustrating an example computer system with which the client and server of FIG. 4 can be implemented.

FIG. 5 is a block diagram illustrating an exemplary computer system 500 with which the client 410 and server 430 of FIG. 4 can be implemented. In certain aspects, the computer system 500 may be implemented using hardware or a combination of software and hardware, either in a dedicated server, integrated into another entity, or distributed across multiple entities.

Computer system 500 (e.g., client 410 and server 430) includes a bus 508 or other communication mechanism for communicating information, and a processor 502 (e.g., processor 412 and 436) coupled with bus 508 for processing information. By way of example, the computer system 500 may be implemented with one or more processors 502. Processor 502 may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information.

Computer system 500 can include, in addition to hardware, code that creates an execution environment for the computer program in question. e.g., code that constitutes processor firmware, a protocol stack, a database management system, an operating system, or a combination of one or more of them stored in an included memory 504, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to bus 508 for storing information and instructions to be executed by processor 502. The processor 502 and the memory 504 can be supplemented by, or incorporated in, special purpose logic circuitry.

The instructions may be stored in the memory 504 and implemented in one or more computer program products. i.e., one or more modules of computer program instructions encoded on a computer readable medium for execution by, or to control the operation of, the computer system 500, and according to any method well known to those of skill in the art, including, but not limited to, computer languages such as data-oriented languages (e.g., SQL, dBase), system languages (e.g., C, Objective-C, C++, Assembly), architectural languages (e.g., Java, .NET), and application languages (e.g., PHP, Ruby, Perl, Python). Instructions may also be implemented in computer languages such as array languages, aspect-oriented languages, assembly languages, authoring languages, command line interface languages, compiled languages, concurrent languages, curly-bracket languages, dataflow languages, data-structured languages, declarative languages, esoteric languages, extension languages, fourth-generation languages, functional languages, interactive mode languages, interpreted languages, iterative languages, list-based languages, little languages, logic-based languages, machine languages, macro languages, metaprogramming languages, multiparadigm languages, numerical analysis, non-English-based languages, object-oriented class-based languages, object-oriented prototype-based languages, off-side rule languages, procedural languages, reflective languages, rule-based languages, scripting languages, stack-based languages, synchronous languages, syntax handling languages, visual languages, wirth languages, and xml-based languages. Memory 504 may also be used for storing temporary variable or other intermediate information during execution of instructions to be executed by processor 502.

A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network. The processes and logic flows described in this specification can be performed by one or more programmable processors executing one or more computer programs to perform functions by operating on input data and generating output.

Computer system 500 further includes a data storage device 506 such as a magnetic disk or optical disk, coupled to bus 508 for storing information and instructions. Computer system 500 may be coupled via input/output module 510 to various devices. The input/output module 510 can be any input/output module. Exemplary input/output modules 510 include data ports such as USB ports. The input/output module 510 is configured to connect to a communications module 512. Exemplary communications modules 512 include networking interface cards, such as Ethernet cards and modems. In certain aspects, the input/output module 510 is configured to connect to a plurality of devices, such as an input device 514 and/or an output device 516. Exemplary input devices 514 include a keyboard and a pointing device, e.g., a mouse or a trackball, by which a user can provide input to the computer system 500. Other kinds of input devices 514 can be used to provide for interaction with a user as well, such as a tactile input device, visual input device, audio input device, or brain-computer interface device. For example, feedback provided to the user can be any form of sensory feedback, e.g., visual feedback, auditory feedback, or tactile feedback, and input from the user can be received in any form, including acoustic, speech, tactile, or brain wave input. Exemplary output devices 516 include display devices such as a LCD (liquid crystal display) monitor, for displaying information to the user, or diagnostic devices such as an oscilloscope.

According to one aspect of the present disclosure, the processor 338 can be implemented using a computer system 500 in response to processor 502 executing one or more sequences of one or more instructions contained in memory 504. Such instructions may be read into memory 504 from another machine-readable medium, such as data storage device 506. Execution of the sequences of instructions contained in the main memory 504 causes processor 502 to perform the process steps described herein. One or more processors in a multi-processing arrangement may also be employed to execute the sequences of instructions contained in the memory 504. In alternative aspects, hard-wired circuitry may be used in place of or in combination with software instructions to implement various aspects of the present disclosure. Thus, aspects of the present disclosure are not limited to any specific combination of hardware circuitry and software.

Various aspects of the subject matter described in this specification can be implemented in a computing system that includes a back end component, e.g., such as a data server, or that includes a middleware component. e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. The communication network can include, for example, any one or more of a LAN, a WAN, the Internet, and the like. Further, the communication network can include, but is not limited to, for example, any one or more of the following network topologies, including a bus network, a star network, a ring network, a mesh network, a star-bus network, tree or hierarchical network, or the like. The communications modules can be, for example, modems or Ethernet cards.

Computer system 500 can include clients and servers. A client and server are generally remote from each other and typically interact through a communication network. The relationship of client and server arises by virtue of computer programs running on the respective computers and having a client-server relationship to each other. Computer system 500 can be, for example, and without limitation, a desktop computer, laptop computer, or tablet computer. Computer system 500 can also be embedded in another device, for example, and without limitation, a mobile telephone such as a smartphone.

The term "machine-readable storage medium" or "computer readable medium" as used herein refers to any medium or media that participates in providing instructions to processor 502 for execution. Such a medium may take many forms, including, but not limited to, non-volatile media, volatile media, and transmission media. Non-volatile media include, for example, optical or magnetic disks, such as data storage device 506. Volatile media include dynamic memory, such as memory 504. Transmission media include coaxial cables, copper wire, and fiber optics, including the wires that comprise bus 508. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, or any other medium from which a computer can read. The machine-readable storage medium can be a machine-readable storage device, a machine-readable storage substrate, a memory device, a composition of matter effecting a machine-readable propagated signal, or a combination of one or more of them.

Various examples of aspects of the disclosure are described below. These are provided as examples, and do not limit the subject technology.

In one embodiment of the subject technology, a method includes obtaining drill bit data from a plurality of data sources through one or more application programming interfaces communicably coupled to a processor circuit. The method includes integrating, in a data integration engine executed on the processor circuit, the drill bit data from each of the plurality of data sources into an integrated dataset. The method includes pre-processing, in a data pre-process engine executed on the processor circuit, the integrated dataset to filter out one or more outlier data points from the integrated dataset. The method includes processing, in the processor circuit, the filtered dataset with a neural network to build a machine learning based model. The method includes processing, in the processor circuit, the machine learning based model to extract one or more features that indicate significant parameters affecting wear on a chill bit. The method includes determining a repair type prediction with the applied machine learning based model based on the extracted one or more features, the repair type prediction indicating a repair action for a cutter on a drill bit. The method also includes providing a signal indicating a value of the repair type prediction for facilitating a drill bit operation on a cutter of the drill bit based on the repair type prediction.

In one embodiment of the subject technology, a system includes a drilling string comprising a drill bit coupled to a distal end of the drilling string, and a machine learning based device operably coupled to the drilling string and having a memory and a processor. The memory comprises commands which, when executed by the processor, cause the machine learning based device to obtain drill bit data from a plurality of data sources through one or more application programming interfaces communicably coupled to the processor, combine data from each of the plurality of data sources into an integrated dataset, pre-process the integrated types of data to filter outliers from the integrated dataset, generate a plurality of neural network models using the integrated dataset as training data, select one or more of the plurality of neural network models based on a user objective, process, in a processing circuit, the selected one or more neural network models to extract features of a drill bit and determine significant parameters affecting wear, determine a repair type prediction value corresponding to a highest accuracy value based on the extracted features, and provide a signal indicating the repair type prediction value for facilitating a drill bit operation on a cutter of a drill bit based on the repair type prediction value.

In one embodiment of the subject technology, a non-transitory computer-readable medium storing instructions which, when executed by a processor, cause a computer to obtain drill bit data from a plurality of data sources through one or more application programming interfaces communicably coupled to a processor circuit, integrate, in a data integration engine executed on the processor circuit, the drill bit data from each of the plurality of data sources into an integrated dataset, pre-process, in a data pre-process engine executed on the processor circuit, the integrated dataset to filter out one or more outlier data points from the integrated dataset, process, in the processor circuit, the filtered dataset to a neural network to build a machine learning based model, process, in the processor circuit, the machine learning based model to extract one or more features that indicate significant parameters affecting wear on a drill bit, determine a repair type prediction with the applied machine learning based model based on the extracted one or more features, the repair type prediction indicating a repair action for a cutter on a drill bit, and provide a signal indicating a value of the repair type prediction for facilitating a drill bit operation on a cutter of the drill bit based on the repair type prediction.

In one or more aspects, examples of clauses are described below.

A method comprising one or more methods, operations or portions thereof described herein.

An apparatus comprising one or more memories and one or more processors (e.g., 500), the one or more processors configured to cause performing one or more methods, operations or portions thereof described herein.

An apparatus comprising one or more memories (e.g., 504, one or more internal, external or remote memories, or one or more registers) and one or more processors (e.g., 502) coupled to the one or more memories, the one or more processors configured to cause the apparatus to perform one or more methods, operations or portions thereof described herein.

An apparatus comprising means (e.g., 500) adapted for performing one or more methods, operations or portions thereof described herein.

A processor (e.g., 502) comprising modules for carrying out one or more methods, operations or portions thereof described herein.

A hardware apparatus comprising circuits (e.g., 500) configured to perform one or more methods, operations or portions thereof described herein.

An apparatus comprising means (e.g., 500) adapted for performing one or more methods, operations or portions thereof described herein.

An apparatus comprising components (e.g., 500) operable to carry out one or more methods, operations or portions thereof described herein.

A computer-readable storage medium (e.g., 504, one or more internal, external or remote memories, or one or more registers) comprising instructions stored therein, the instructions comprising code for performing one or more methods or operations described herein.

A computer-readable storage medium (e.g., 504, one or more internal, external or remote memories, or one or more registers) storing instructions that, when executed by one or more processors, cause one or more processors to perform one or more methods, operations or portions thereof described herein.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

To illustrate the interchangeability of hardware and software, items such as the various illustrative blocks, modules, components, methods, operations, instructions, and algorithms have been described generally in terms of their functionality. Whether such functionality is implemented as hardware, software or a combination of hardware and software depends upon the particular application and design constraints imposed on the overall system. Skilled artisans may implement the described functionality in varying ways for each particular application.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements.

Headings and subheadings, if any, are used for convenience only and do not limit the subject technology. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

The disclosure is provided to enable any person skilled in the art to practice the various aspects described herein. In some instances, well-known structures and components are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

Therefore, the subject technology is well adapted to attain the ends and advantages mentioned as well as those that are inherent therein. The particular embodiments disclosed above are illustrative only, as the subject technology may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the subject technology. The subject technology illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b." or, equivalently, "from approximately a to b." or, equivalently. "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces. If there is any conflict in the usages of a word or term in this specification and one or more patent or other documents that may be incorporated herein by reference, the definitions that are consistent with this specification should be adopted.

What is claimed is:

1. A method, comprising:
    obtaining drill bit data from a plurality of data sources through one or more application programming interfaces communicably coupled to a processor circuit, the drill bit data including formation lithology information indicating a formation lithology, a drill bit design and a repair history for the formation lithology including a historical distribution of repairs made to individual cutter positions on drill bits that have features of the drill bit design and that have drilled into formations of the formation lithology;
    integrating, in a data integration engine executed on the processor circuit, the drill bit data from each of the plurality of data sources into an integrated dataset;
    pre-processing, in a data pre-process engine executed on the processor circuit, the integrated dataset to filter out one or more outlier data points from the integrated dataset;
    processing, in the processor circuit, the filtered dataset with a neural network to build a machine learning based model;
    processing, in the processor circuit, the machine learning based model to extract one or more features that indicate significant parameters affecting wear on a drill bit;

determining, before drilling a wellbore, a repair type prediction with the machine learning based model based on the extracted one or more features, the repair type prediction indicating a predicted type of repair action for the individual cutter positions on the drill bit if drilled into a formation that has the formation lithology;

generating a repair schedule for performing one or more repair actions for the individual cutter positions based on the predicted type of repair actions;

drilling at least a portion of the wellbore into the formation that has the formation lithology; and providing, after the drilling, a signal indicating a value of the repair type prediction for facilitating a drill bit operation on a cutter of the drill bit based on the repair type prediction.

2. The method of claim 1, wherein the drill bit data further includes one or more of performance data, formation data, dull characteristics, or cutter physical properties.

3. The method of claim 2, wherein the performance data is a dataset that includes operating conditions during a drilling operation, a total length of a drilled wellbore, weight-on-bit (WOB) information, rotational information including revolutions-per- minute (RPM), and rate-of-penetration (ROP) data.

4. The method of claim 2, wherein the dull characteristics is a dataset that classifies wear into recognized wear patterns.

5. The method of claim 2, wherein the cutter physical properties is a dataset that includes parameters describing abrasion resistance, thermal and mechanical integrity, and impact resistance.

6. The method of claim 1, wherein the pre-processing comprises utilizing one or more filtering algorithms with the data pre-process engine to remove one or more data points from the integrated dataset that exceed a predetermined threshold or reside outside a predetermined cluster of data points by a measured amount.

7. The method of claim 1, wherein the pre-processing comprises calculating one or more of a plurality of variables with the data pre-process engine, wherein the plurality of variables respectively indicate 1) a last repair type, 2) a wellbore trajectory during a drill bit run, 3) a diamond volume distribution, 4) a total length traveled by a cutter during a drilling operation, 5) total energy absorbed by each cutter during a drilling operation, 6) a normalized distance of each cutter from a center of a drill bit.

8. The method of claim 7, wherein the pre-processing comprises:
determining whether real-time drilling data is available with the data pre-process engine, and
calculating statistical properties for each of the plurality of variables when the real-time drilling data is available, wherein the calculated statistical properties indicate a relationship between cutter wear and a variation in the plurality of variables.

9. The method of claim 1, wherein the repair type prediction is determined based on drilling parameters, cutter design and position, and subterranean formation lithology.

10. The method of claim 1, further comprising:
training the neural network as a feedforward network using input variables from the integrated dataset, wherein each of the input variables is assigned to a weighted classification associated with the feedforward network.

11. The method of claim 1, further comprising:
selecting between a plurality of classes of machine learning based models based on a user objective,
wherein a decision tree model of the plurality of classes of machine learning based models is selected when the user objective is to gain visual insight about decision making,
wherein a deep learning based model of the plurality of classes of machine learning based models is selected when the user objective is to use results for optimization, and
wherein the machine learning based model corresponds to the selected deep learning base d model.

12. The method of claim 1, wherein determining the repair type prediction comprises selecting the machine learning based model with a repair type prediction value corresponding to a highest accuracy value based on the extracted one or more features.

13. The method of claim 1, further comprising generating a candidate drill bit design for reducing wear or increasing drilling performance based on the repair type prediction.

14. The method of claim 1, further comprising forecasting a required inventory of drill bits based on the repair type prediction.

15. A system, comprising:
a drilling string comprising a drill bit coupled to a distal end of the drilling string; and
a machine learning based device operably coupled to the drilling string and having a memory and a processor, wherein the memory comprises commands which, when executed by the processor, cause the machine learning based device to:
obtain drill bit data from a plurality of data sources through one or more application programming interfaces communicably coupled to the processor, the drill bit data including formation lithology information indicating a formation lithology, a drill bit design and a history of repairs made to individual cutter positions on drill bits that have features of the drill bit design and that have drilled into formations of the formation lithology;
combine data from each of the plurality of data sources into an integrated dataset;
pre-process the integrated dataset to filter outliers from the integrated dataset;
generate a plurality of neural network models using the integrated dataset as training data;
select one or more of the plurality of neural network models based on a user objective;
process, in a processing circuit, the selected one or more neural network models to extract features of a drill bit and determine significant parameters affecting wear;
determine, before a wellbore is drilled, a repair type prediction value corresponding to a highest accuracy value based on the extracted features, the repair type prediction indicating a predicted type of repair action for individual cutter positions on the drill bit if drilled into a formation that has the formation lithology;
generate a repair schedule for performing one or more repair actions for the individual cutter positions based on the predicted type of repair actions; perform operations to drill, via the drill bit, at least a portion of the wellbore into the formation that has the formation lithology; and provide a signal indicating the repair type prediction value for facilitating a drill bit operation on a cutter of the drill bit based on the repair type prediction value.

16. The system of claim 15, wherein the commands which, when executed by the processor, further cause the system to:
   train the neural network models as a feedforward network using input variables from the integrated dataset, wherein each of the input variables is assigned to a weighted classification associated with the feedforward network.

17. The system of claim 15, wherein the commands which, when executed by the processor, further cause the system to:
   select between a plurality of classes of machine learning based models based on a user objective,
   wherein a decision tree model of the plurality of classes of machine learning based models is selected when the user objective is to gain visual insight about decision making, and
   wherein a deep learning based model of the plurality of classes of machine learning based models is selected when the user objective is to use results for optimization.

18. A non-transitory computer-readable medium storing instructions which, when executed by a processor, cause a computer to:
   obtain drill bit data from a plurality of data sources through one or more application programming interfaces communicably coupled to a processor circuit, the drill bit data including formation lithology information indicating a formation lithology, a drill bit design and a repair history including a historical distribution of repairs made to individual cutter positions on drill bits having features of the drill bit design and that have drilled into formations of the formation lithology;
   integrate, in a data integration engine executed on the processor circuit, the drill bit data from each of the plurality of data sources into an integrated dataset;
   pre-process, in a data pre-process engine executed on the processor circuit, the integrated dataset to filter out one or more outlier data points from the integrated dataset;
   process, in the processor circuit, the filtered dataset to a neural network to build a machine learning based model;
   process, in the processor circuit, the machine learning based model to extract one or more features that indicate significant parameters affecting wear on a drill bit;
   determine, before a wellbore is drilled, a repair type prediction with the applied machine learning based model based on the extracted one or more features, the repair type prediction indicating a predicted type of repair action for the individual cutter positions on the drill bit if drilled into a formation that has the formation lithology;
   generate a repair schedule for performing one or more repair actions for the individual cutter positions based on the predicted type of repair actions; perform operations to drill, via the drill bit, at least a portion of the wellbore into the formation that has the formation lithology; and
   provide a signal indicating a value of the repair type prediction for facilitating a drill bit operation on a cutter of the drill bit based on the repair type prediction.

19. The non-transitory computer-readable medium of claim 18, wherein the instructions which, when executed by the processor, further cause the computer to:
   select the machine learning based model with a repair type prediction value corresponding to a highest accuracy value based on the extracted one or more features.

20. The non-transitory computer-readable medium of claim 18, wherein the instructions which, when executed by the processor, further cause the computer to:
   select between a plurality of classes of machine learning based models based on a user objective,
   wherein a decision tree model of the plurality of classes of machine learning based models is selected when the user objective is to gain visual insight about decision making,
   wherein a deep learning based model of the plurality of classes of machine learning based models is selected when the user objective is to use results for optimization, and
   wherein the applied machine learning based model corresponds to the selected model.

* * * * *